United States Patent
Fang et al.

(10) Patent No.: US 10,033,358 B2
(45) Date of Patent: Jul. 24, 2018

(54) BUFFER CIRCUIT AND VOLTAGE GENERATOR USING THE SAME

(71) Applicant: ALi Corporation, Hsinchu (TW)

(72) Inventors: Wei-Chieh Fang, Hsinchu (TW); Chien-Yuan Lu, Hsinchu (TW)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 15/286,969

(22) Filed: Oct. 6, 2016

(65) Prior Publication Data
US 2017/0141767 A1   May 18, 2017

(30) Foreign Application Priority Data
Nov. 18, 2015 (CN) .......................... 2015 1 0794458

(51) Int. Cl.
| | |
|---|---|
| H03K 3/00 | (2006.01) |
| H03K 3/356 | (2006.01) |
| H02M 3/07 | (2006.01) |
| H02M 1/08 | (2006.01) |

(52) U.S. Cl.
CPC ........ *H03K 3/356017* (2013.01); *H02M 3/07* (2013.01); *H03K 3/356086* (2013.01); *H02M 1/08* (2013.01)

(58) Field of Classification Search
CPC ....... H03K 19/00361; H03K 19/00315; H03K 19/018521; H03K 3/356113; H03K 19/018528; H03K 5/02; H04L 25/028; H04L 25/0272; H04L 25/0292
See application file for complete search history.

(56) References Cited

U.S. PATENT DOCUMENTS

| | | | |
|---|---|---|---|
| 7,847,590 B2 * | 12/2010 | Pamperin | H03K 3/356113 326/68 |
| 8,395,433 B2 | 3/2013 | Rien et al. | |
| 2005/0110574 A1 | 5/2005 | Richard et al. | |
| 2008/0018383 A1 | 1/2008 | Conte et al. | |
| 2015/0145584 A1 * | 5/2015 | Kim | H03K 19/017509 327/333 |

* cited by examiner

*Primary Examiner* — Long Nguyen
(74) *Attorney, Agent, or Firm* — Rabin & Berdo, P.C.

(57) ABSTRACT

A buffer circuit includes a transistor cascode circuit, a latch circuit, a first transistor, a second transistor, and a voltage generator. The transistor cascode circuit is biasing at a first voltage. The latch circuit is biasing at a second voltage, whose voltage level is negative. The first transistor and the second transistor are coupling between the transistor cascode circuit and the latch circuit, and a gate of the first transistor is coupled to a gate of the second transistor. The voltage generator provides a biasing voltage to the gate of the first transistor and adjusts a voltage level of the biasing voltage dynamically according to a voltage level of the second voltage. The biasing voltage is at a first level when the buffer circuit is initially turned on, and the biasing voltage is at a second level when the buffer circuit enters the steady state.

19 Claims, 10 Drawing Sheets

US 10,033,358 B2

BUFFER CIRCUIT AND VOLTAGE GENERATOR USING THE SAME

CROSS REFERENCE TO RELATED APPLICATIONS

This application claims the benefit of People's Republic of China application Serial No. 201510794458.3, filed Nov. 18, 2015, the disclosure of which is incorporated by reference herein in its entirety.

TECHNICAL FIELD

The disclosure relates in general to a buffer circuit and a voltage generator using the same, and more particularly to prevent an electrical over-stress issue on a buffer circuit and a voltage generator using the same.

BACKGROUND

Conventional buffer circuit includes multiple transistors, and is biased at a first voltage level +VDD and a second voltage level −VDD. In order to make these transistors fully turned on and fully turned off, all terminals of these transistors may be operated at the voltage levels between −VDD to +VDD. In this case, two terminals of some transistors may suffer the voltage difference more than the voltage level of VDD, causing the damage of the transistor. One way to avoid the electrical over-stress issue is to use the component which is capable of operating with high voltage supplies while being fabricated using a specific technology as a switch allows for larger voltage difference. However, this method results in increasing the overall cost of the buffer circuit. Therefore, it is a prominent task for the industry to solve the problem and provide a buffer circuit preventing from the electrical over-stress issue without the use of the high voltage component.

SUMMARY

According to one embodiment, a buffer circuit is provided. The buffer circuit has an input terminal for receiving an input signal and an output terminal for providing an output signal. The buffer circuit includes a transistor cascode circuit, a latch circuit, a first transistor, a second transistor, and a voltage generator. The transistor cascode circuit is biased at a first voltage, and the transistor cascode circuit receives the input signal. The latch circuit is biased at a second voltage, and the voltage level of the second voltage is negative. The first transistor and the second transistor are coupled between the transistor cascode circuit and the latch circuit, and a gate terminal of the first transistor is coupled to a gate terminal of the second transistor. The voltage generator provides a biasing voltage to the gate terminals of the first transistor and the second transistor according to the second voltage. The voltage generator adjusts a voltage level of the biasing voltage dynamically according to a voltage level of the second voltage. The biasing voltage is at a first level when the buffer circuit is initially turned on, and the biasing voltage is at a second level when the buffer circuit enters a steady state.

According to another embodiment, a voltage generator is provided. The voltage generator includes a charge pump circuit. The voltage generator uses a buffer circuit. The buffer circuit has an input terminal for receiving an input signal and an output terminal for providing an output signal. The buffer circuit includes a transistor cascode circuit, a latch circuit, a first transistor, a second transistor, and a voltage generator. The transistor cascode circuit is biased at a first voltage, and the transistor cascode circuit receives the input signal. The latch circuit is biased at a second voltage, and the voltage level of the second voltage is negative. The first transistor and the second transistor are coupled between the transistor cascode circuit and the latch circuit, and a gate terminal of the first transistor is coupled to a gate terminal of the second transistor. The voltage generator provides a biasing voltage to the gate terminals of the first transistor and the second transistor according to the second voltage. The voltage generator adjusts a voltage level of the biasing voltage dynamically according to a voltage level of the second voltage. The biasing voltage is at a first level when the buffer circuit is initially turned on, and the biasing voltage is at a second level when the buffer circuit enters a steady state.

According to yet another embodiment, another voltage generator is provided. The voltage generator includes a charge pump circuit and a buffer circuit. The buffer circuit has an input terminal for receiving an input signal and an output terminal for providing an output signal. The buffer circuit includes a transistor cascode circuit, a latch circuit, a first transistor, a second transistor, and a voltage generator. The transistor cascode circuit is biased at a first voltage, and the transistor cascode circuit receives the input signal. The latch circuit is biased at a second voltage, and the voltage level of the second voltage is negative. The first transistor and the second transistor are coupled between the transistor cascode circuit and the latch circuit, and a gate terminal of the first transistor is coupled to a gate terminal of the second transistor. The voltage generator provides a biasing voltage to the gate terminals of the first transistor and the second transistor according to the second voltage. The voltage generator adjusts a voltage level of the biasing voltage dynamically according to a voltage level of the second voltage. The biasing voltage is at a first level when the buffer circuit is initially turned on, and the biasing voltage is at a second level when the buffer circuit enters a steady state.

The above and other aspects of the invention will become better understood with regard to the following detailed description of the preferred but non-limiting embodiment(s). The following description is made with reference to the accompanying drawings.

Figure 1:
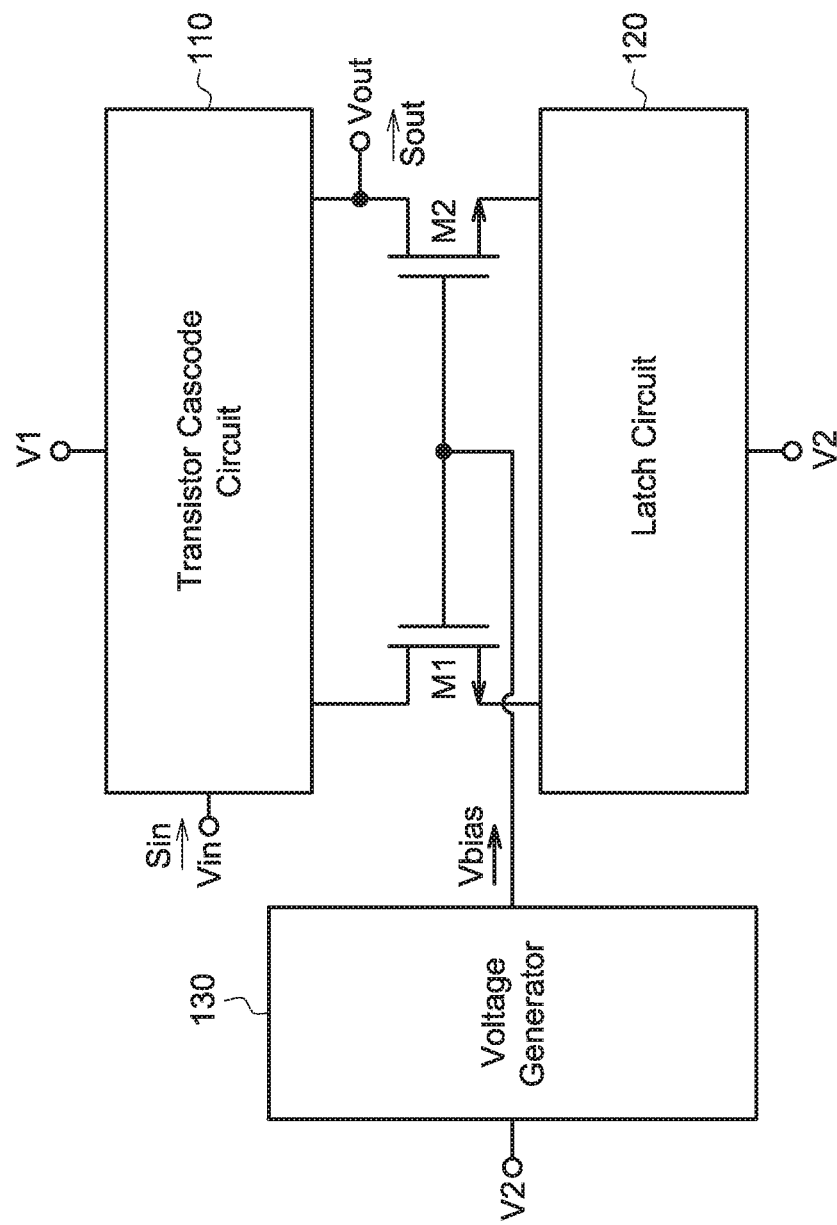
FIG. 1 shows a schematic diagram of a buffer circuit according to the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a schematic diagram of a buffer circuit 100 according to the first embodiment of the present disclosure. The buffer circuit 100 has an input terminal Vin and an output terminal Vout. The input terminal Vin receives an input signal Sin. The output terminal Vout provides an output signal Sout. The buffer circuit 100 includes a transistor cascode circuit 110, a latch circuit 120, a first transistor M1, a second transistor M2, and a voltage generator 130. The transistor cascode circuit 110 is biased at a first voltage V1, and receives the input signal Sin. The latch circuit 120 is biased at a second voltage V2, and wherein the voltage level of the second voltage V2 is negative. The first transistor M1 and the second transistor M2 are coupled between the transistor cascode circuit 110 and the latch circuit 120, and a gate terminal of the first transistor M1 is coupled to a gate terminal of the second transistor M2. The voltage generator 130 provides a biasing voltage Vbias to the gate terminals of the first transistor M1 and the second transistor M2 according to the second voltage V2. The voltage generator 130 adjusts the voltage level of the Vbias dynamically according to the voltage level of the second voltage V2. The biasing voltage Vbias is at a first level when the buffer circuit 100 is initially turned on, and the biasing voltage Vbias is at a second level when the buffer circuit 100 enters the steady state.

In an embodiment, the buffer circuit 100 is biased at the first voltage V1 and the second voltage V2. The voltage level of the first voltage V1 is +VDD, and the voltage level of the second voltage V2 is −VDD. The input signal Sin has the amplitude between the voltage level of the ground voltage (0V) and the voltage level of the first voltage V1 (VDD). The output signal Sout has the amplitude between the voltage level of the second voltage V2 (−VDD) and the voltage level of the first voltage V1 (VDD). When the buffer circuit 100 is initially turned on, meanwhile, the voltage level of the second voltage V2 is at 0V, and the biasing voltage Vbias is at the first level, which is greater than a sum of the voltage level of the source voltage of the transistor M2 and the threshold voltage of the transistor M2 so that to turn on the transistor M2. Then, when the buffer circuit 100 enters the steady state, meanwhile, the voltage level of the second voltage V2 has reached at −VDD, and the biasing voltage Vbias is at a second level. As the voltage level of the second voltage decreases gradually to −VDD, the voltage level of the biasing voltage is approaching to 0V so that to turn on the transistor M2. It is known by the person skilled in the art that the biasing voltage Vbias is not exactly equal to 0V, but is substantially equal to or approaching to 0V.

Figure 2:
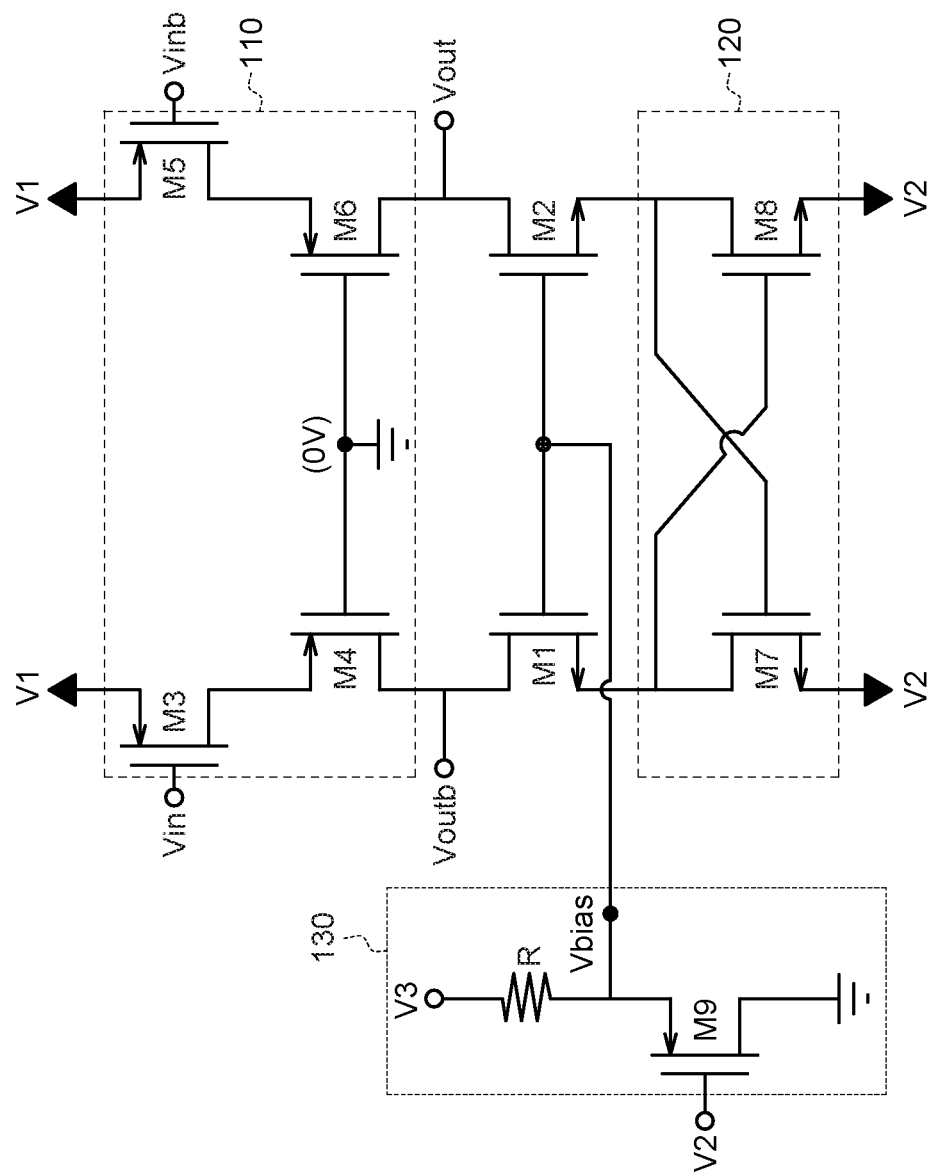
FIG. 2 shows a schematic diagram illustrating an example of the buffer circuit as shown in FIG. 1.

Specifically, FIG. 2 shows a schematic diagram illustrating an example of the buffer circuit as shown in FIG. 1. In an embodiment, the transistor cascode circuit 110 includes 4 transistors M3-M6, for example. The transistor M3 is coupled to the input terminal Vin for receiving the input signal Sin, and is biased at the first voltage V1. The transistor M4 is coupled between the transistor M3 and the transistor M1. And, there is a node Voutb between the transistor M4 and the transistor M1. The transistor M5 is coupled to a node Vinb for receiving an inverting signal of the input signal Sin, and is biased at the first voltage V1. The transistor M6 is coupled between the transistor M5 and the transistor M2. And, there is the output terminal Vout between the transistor M6 and the transistor M2. The gate terminal of the transistor M6 is coupled to the gate terminal of the transistor M4. In other embodiments, the transistor cascode circuit 110 may include more cascoding transistors, and the present disclosure is not limited thereto.

In an embodiment, the latch circuit 120 includes transistors M7 and M8. The transistor M7 is coupled to the transistor M1, and is biased at the second voltage V2. The gate terminal of the transistor M7 is coupled to the transistor M2. The transistor M8 is coupled to the transistor M2, and is biased at the second voltage V2. The gate terminal of the transistor M8 is coupled to the transistor M1. In other embodiments, the latch circuit 120 may include more transistors cascoding between the transistor M7 or the transistor M8 and the terminal of the second voltage V2, and the present disclosure is not limited thereto.

In this embodiment, the voltage generator 130 includes a resistor R and a transistor M9. The first terminal of the resistor R receives the third voltage V3. The voltage level of the third voltage V3 is set at the voltage level greater than the first level of the biasing voltage Vbias when the buffer circuit 100 is initially turned on so that to turn on the transistor M2. The first terminal of the transistor M9 is coupled to the second terminal of the resistor R for providing the biasing voltage Vbias. The second terminal of the transistor M9 is coupled to the ground terminal. The control terminal of the transistor M9 receives the second voltage V2.

While in operation, when the buffer circuit 100 is initially turned on, the second voltage V2 is at 0V, and the transistor M9 is turned off so that the resistor R receives the third voltage V3 and provides the biasing voltage with the first level via the second terminal. And then, when the buffer circuit 200 enters the steady state, the voltage level of the second voltage V2 has reached at −VDD, and the transistor M9 is turned on and then grounded so that the first terminal of the transistor M9 provides the biasing voltage Vbias which the voltage level of the biasing voltage Vbias is substantially equal to the ground level. As the second voltage V2 decreases gradually to −VDD, the biasing voltage Vbias is gradually approaching to 0V since the transistor M9 is turned on. It is known by the person skilled in the art that the biasing voltage Vbias is not exactly equal to 0V, but is substantially equal to or approaching to 0V.

Figure 3A:
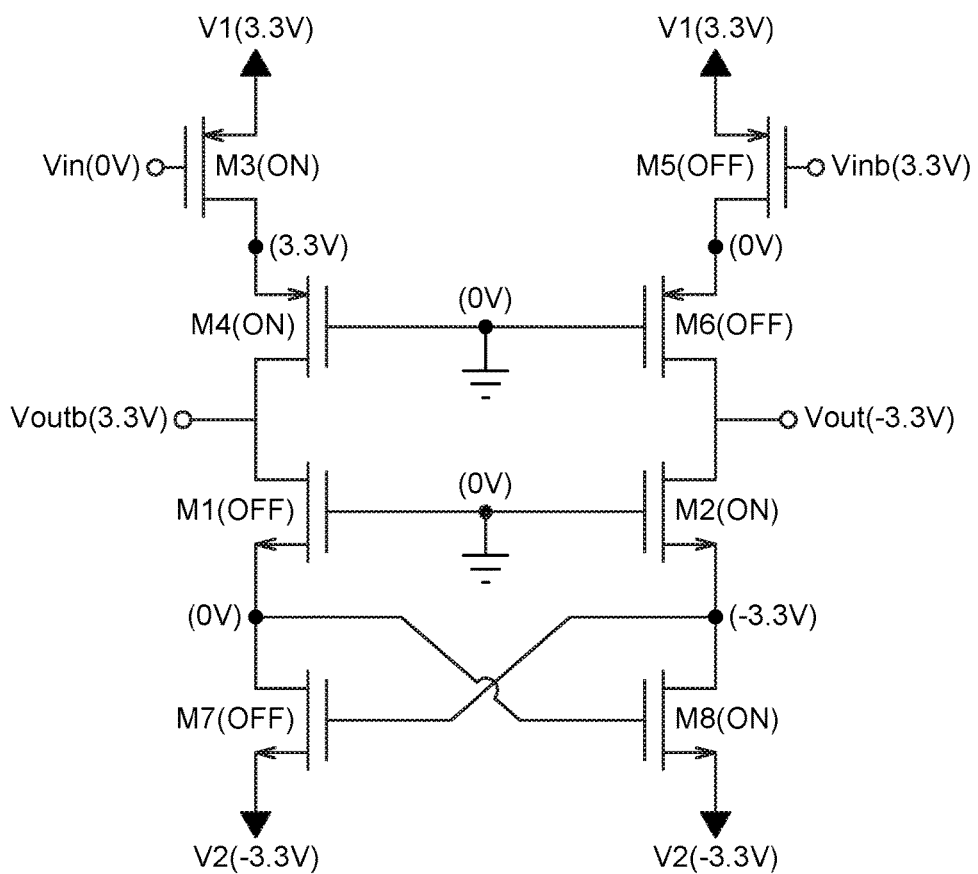
FIG. 3A and FIG. 3B show schematic diagrams illustrating the operating voltage level of all transistors and the voltage level of all nodes in a first cycle and a second cycle, respectively, when the buffer circuit as shown in FIG. 2 is initially turned on and in the steady state.
Figure 3B:
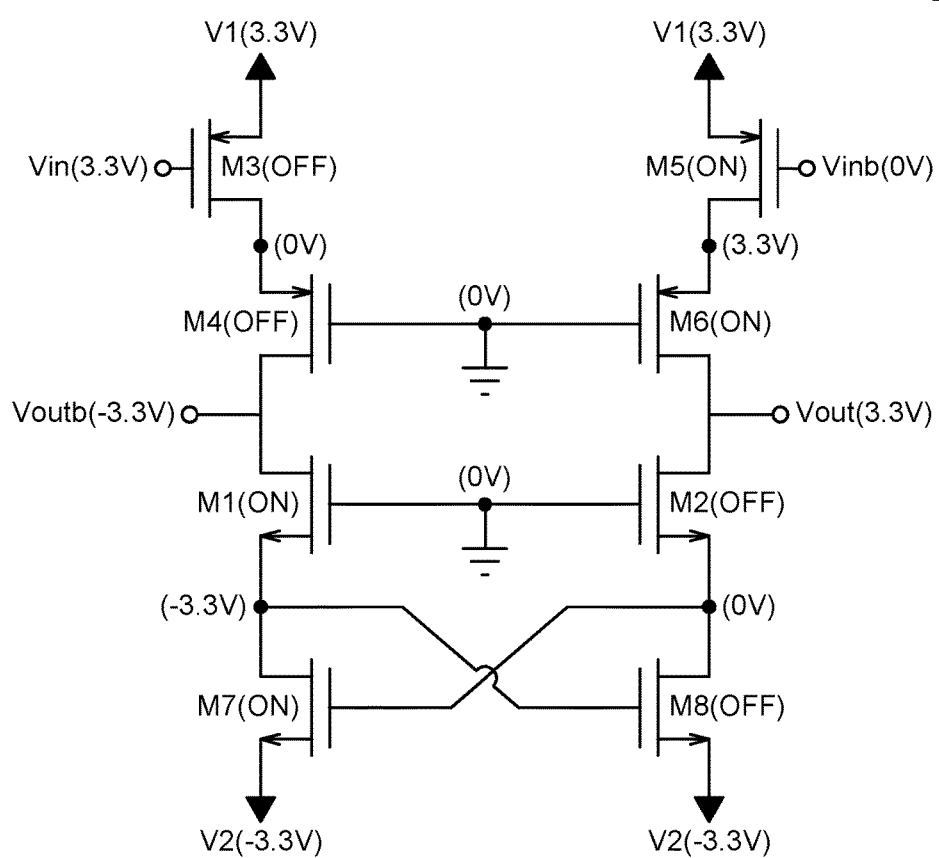

Please refer to FIG. 3A and FIG. 3B for illustrating the operation of the buffer circuit 100. FIG. 3A and FIG. 3B show schematic diagrams illustrating the operating voltage level of all transistors and the voltage level of all nodes in a first cycle and a second cycle, respectively, when the buffer circuit as shown in FIG. 2 enters the steady state. In the first cycle, the voltage level of the input signal Sin is 0V, as shown in FIG. 3, meanwhile, the source terminal of the transistor M3 is biased at the voltage level of the first voltage V1 (VDD), for example, 3.3V. The gate terminal of the transistor M3 is coupled to the input terminal Vin and receives the input signal Sin of 0V and then is turned on (marked as ON). The source terminal of the transistor M4 is coupled to the drain terminal of the transistor M3, and since the transistor M3 is turned on, the source terminal of the transistor M4 is 3.3V. And, since the gate terminal of the transistor M4 is 0V, the transistor M4 is also turned on so that the drain terminal of the transistor M4, i.e. the node Voutb, is also 3.3V. The source terminal of the transistor M5 is also biased at the voltage level of the first voltage V1 (VDD), i.e. 3.3V. The gate terminal of the transistor M5 is coupled to the input terminal Vinb and then receives the inverting signal of the input signal Sin, i.e. 3.3V, and therefore the transistor M5 is turned off (marked as OFF). The source terminal of the transistor M6 is coupled to the drain terminal of the transistor M5, and since the transistor M5 is turned off, the source terminal of the transistor M6 is 0V. Since the gate terminal of the transistor M6 is 0V, the transistor M6 is also turned off.

In the first cycle, the voltage level of the source terminal of the transistor M1 is equal to the biasing voltage Vbias (0V) in the ideal condition as shown in FIG. 3A. However, due to process variations, the voltage level of the source terminal of the transistor M1 is approaching to the voltage level of the biasing voltage Vbias. Therefore, it is understood by person skilled in the art that the voltage level of the source terminal of the transistor M1 is substantially equal to the voltage level of the biasing voltage Vbias. In an embodiment, the source terminal of the transistor M1 is 0V, and the gate terminal of the transistor M1 is also 0V, and therefore the transistor M1 is turned off. The gate terminal of the transistor M8 is coupled to the source terminal of the transistor M1 which is 0V, and the source terminal of the transistor M8 is biased at the voltage level of the second voltage V2 (−VDD), e.g. −3.3V, and therefore the transistor M8 is turned on. Since the transistor M8 is turned on, the drain terminal of the transistor M8 is −3.3V. The gate terminal of the transistor M7 is coupled to the drain terminal of the transistor M8 which is −3.3V, and the source terminal of the transistor M7 is also biased at the voltage level of the second voltage V2 (−VDD) which is −3.3V, and therefore the transistor M7 is turned off. The source terminal of the transistor M2 is coupled to the drain terminal of the transistor M8 which is −3.3V, and the gate terminal of the transistor M2 is 0V, and therefore the transistor M2 is turned on. Since the transistor M2 is turned on, the drain terminal of the transistor M2 is 3.3V. That is, in the first cycle, the transistor M2 provides the output signal Sout which is −3.3V at the node Vout, as shown in FIG. 3A.

On the other hand, in the second cycle, the voltage level of the input signal Sin is 3V, as shown in FIG. 3B, meanwhile, the drain terminal of the transistor M3 is biased at the voltage level of the first voltage V1 (VDD). i.e. 3.3V. And, the gate terminal of the transistor M3 is coupled to the input terminal Vin and then receives the input signal Sin which is 3.3V and therefore the transistor M3 is turned off. Since the transistor M3 is turned off, the source terminal of the transistor M4 is 0V, and the gate terminal of the transistor M4 is 0V, the transistor M4 is also turned off. The source terminal of the transistor M5 is also biased at the voltage level of the first voltage V1 (VDD), i.e. 3.3V. The gate terminal of the transistor M5 is coupled to the input terminal Vinb and then receives the inverting signal of the input signal Sin, i.e. 0V, and therefore the transistor M5 is turned on. Since the transistor M5 is turned on, and the drain terminal of the transistor M6 is coupled to transistor M5, the source terminal of the transistor M6 is 3.3V. And since the gate terminal of the transistor M6 is 0V, the transistor M6 is also turned on. Since the transistor M6 is turned on, the drain terminal of the transistor M6 is 3.3V. That is, in the second cycle, the transistor M6 provides the output signal Sout which is 3.3V at the node Vout, as shown in FIG. 3B.

In the second cycle, the drain terminal of the transistor M2 is 0V, as shown in FIG. 3B, and the gate terminal of the transistor M2 is also 0V, and therefore the transistor M2 is turned off. The gate terminal of the transistor M7 is coupled to the source terminal of the transistor M2 which is 0V, and the source terminal of the transistor M7 is biased at the voltage level of the second voltage V2 (−VDD), i.e. −3.3V, and therefore the transistor M7 is turned on. Since the transistor M7 is turned on, the drain terminal of the transistor M7 is −3.3V. The gate terminal of the transistor M8 is coupled to the drain terminal of the transistor M7 which is −3.3V, and the source terminal of the transistor M8 is biased at the voltage level of the second voltage V2 (−VDD), which is −3.3V, and therefore the transistor M8 is turned off. The source terminal of the transistor M1 is coupled to the drain terminal of the transistor M7 which is −3.3V, and the gate terminal of the transistor M1 is 0V, and therefore the transistor M1 is turned on. Since the transistor M1 is turned on, the drain terminal of the transistor M1 is −3.3V, that is, the drain terminal of the transistor M1, i.e. the node Voutb, is −3.3V.

Figure 4A:
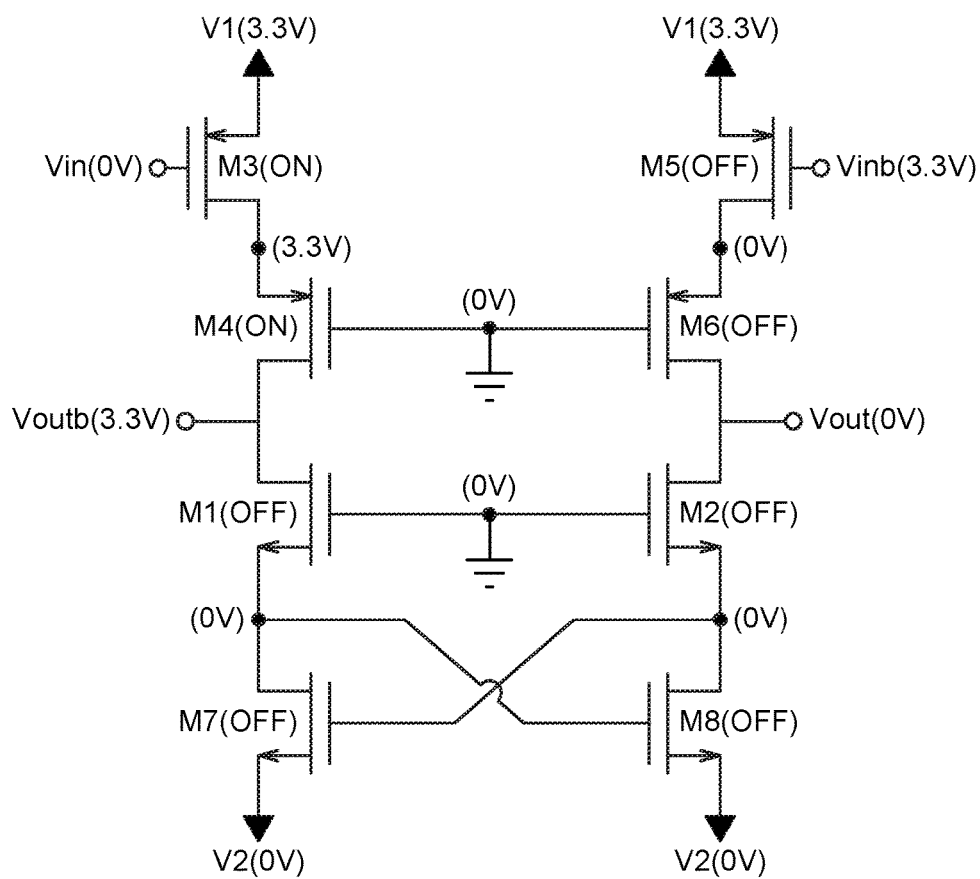
FIG. 4A shows a schematic diagram illustrating the operating voltage level of all transistors and the voltage level of all nodes in the buffer circuit, when the buffer circuit is initially turned on and the biasing voltage is 0V.

As shown in FIG. 3A and FIG. 3B, when the buffer circuit 100 is initially turned on, the biasing voltage Vbias received from the gate terminal of the transistor M1 is 0V. However, when the buffer circuit 100 is initially turned on, the buffer circuit 100 may not operate normally if the biasing voltage Vbias is 0V. Please refer to FIG. 4A. FIG. 4A shows a schematic diagram illustrating the operating voltage level of all transistors and the voltage level of all nodes in the buffer circuit 100, when the buffer circuit 100 is initially turned on and the biasing voltage is 0V. As shown in FIG. 4A, the gate terminal of the transistor M8 is coupled to the source terminal of the transistor M1 which is 0V, and the source terminal of the transistor M8 is biased at the second voltage V2. However, when the buffer circuit 100 is initially turned on, the voltage level of the second voltage V2 is 0V, and therefore the transistor M8 is turned off. And since the transistor M8 is turned off, the drain terminal of the transistor M8 is 0V. The source terminal of the transistor M2 is coupled to the drain terminal of the transistor M8 which is 0V, and the gate terminal of the transistor M2 is 0V, and therefore the transistor M2 is turned off. Since the transistor M2 is turned off, the transistor M2 provides the output signal Sout which is 0V at the node Vout. And since the gate terminal of the transistor M7 is coupled to the drain terminal of the transistor M8 which is 0V, and the source terminal of the transistor M7 is also biased at the second voltage V2 which is 0V, the transistor M7 is also turned off so that the drain terminal of the transistor M7 remains at 0V. That is, when the buffer circuit 100 is initially turned on, the transistor M2 and the transistor M8 may not be turned on if the biasing voltage Vbias which is 0V is provided to the gate terminals of the transistor M1 and the transistor M2, and therefore the output signal Sout which is at −VDD may not be provided at the output terminal Vout.

Figure 4B:
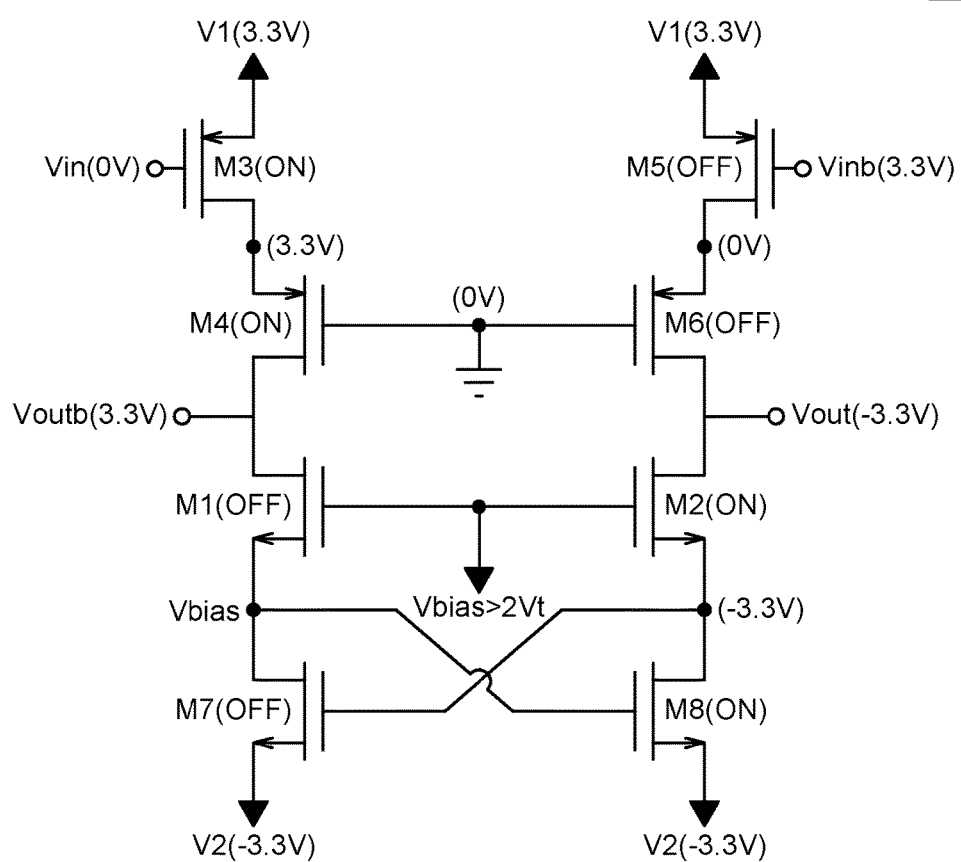
FIG. 4B shows a schematic diagram illustrating the operating voltage level of all transistors and the voltage level of all nodes in the buffer circuit, when the buffer circuit is initially turned on and the voltage level of the biasing voltage is greater than 2Vt.

As a result, when the buffer circuit 100 is initially turned on, a proper voltage level of the biasing voltage Vbias is needed to turn on the transistor M2 and the transistor M8 so that the output signal Sout which is at −VDD may be provided. Please refer to FIG. 4B. FIG. 4B shows a schematic diagram illustrating the operating voltage level of all transistors and the voltage level of all nodes in the buffer circuit 100, when the buffer circuit 100 is initially turned on and the voltage level of the biasing voltage is greater than 2Vt. In this embodiment, the voltage level of a biasing voltage which is greater than two times of the voltage level of the threshold voltage (the threshold voltage of the transistor M2 and the transistor M8) is provided so that the transistor M2 and the transistor M8 are both turned on. In some other embodiments, if more transistors, such as N serial-connected transistors, are coupled between the output terminal Vout and the second voltage V2, a biasing voltage whose voltage level is greater than N*Vt is provided to turn on all the N serial-connected transistors.

Figure 4C:
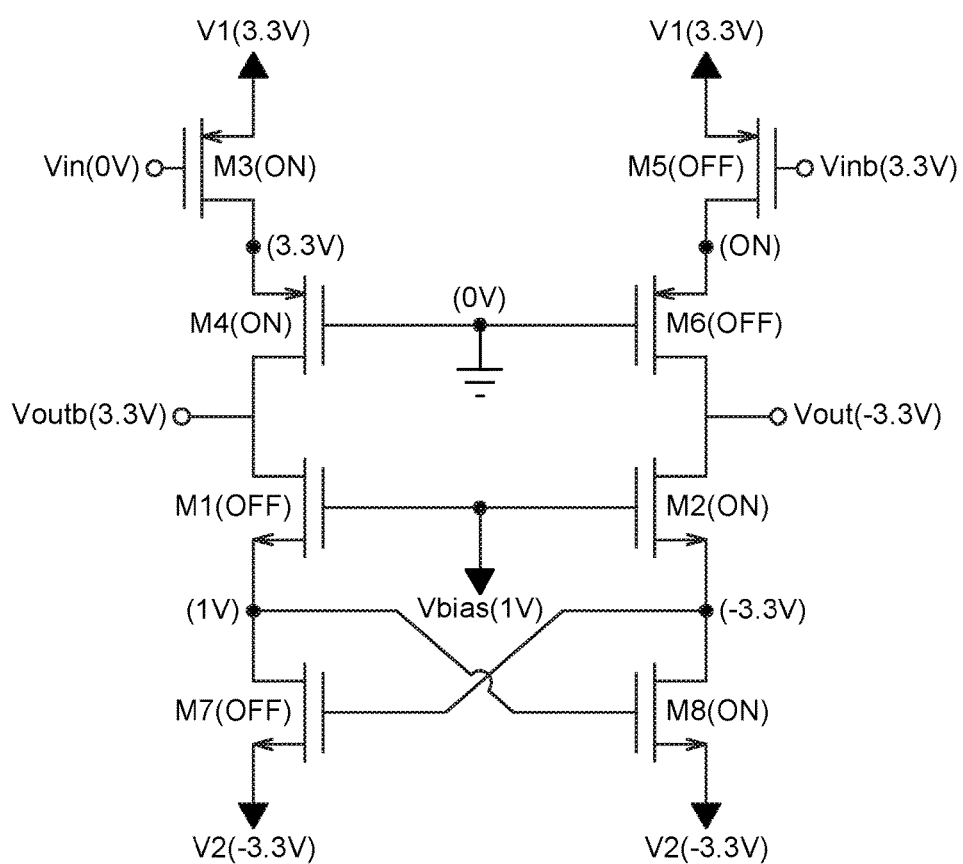
FIG. 4C shows a schematic diagram illustrating the operating voltage level of all transistors and the voltage level of all nodes in the buffer circuit, when the buffer circuit enters the steady state and the voltage level of the biasing voltage is greater than 2Vt.

After the buffer circuit 100 is turned on, as the voltage level of the second voltage V2 changes gradually from 0V to −VDD, although the biasing voltage whose voltage level is greater than two times of the voltage level of the threshold voltage (Vbias>2V) is provided to turn on the transistor M2 and the transistor M8, the transistors are operated under the over-stress situation, and the transistors may be damaged therefore. Please refer to FIG. 4C. FIG. 4C shows a schematic diagram illustrating the operating voltage level of all transistors and the voltage level of all nodes in the buffer circuit 100, when the buffer circuit 100 enters the steady state and the voltage level of the biasing voltage greater than 2Vt is provided. As shown in FIG. 4C, the gate terminal of the transistor M1 receives the biasing voltage whose voltage level is greater than two times of the voltage level of the threshold voltage (Vbias>2V), e.g. 1V, and the source terminal of the transistor M1 is also 1V so that to turn off the transistor M1. The gate terminal of the transistor M8 is coupled to the source terminal of the transistor M1 which is 1V, the source terminal of the transistor M8 is biased at the second voltage V2, i.e. −3.3V, and meanwhile, the transistor M8 is turned on, but operated in electrical over-stress (Vgs=4.3V>VDD(3.3V), and Vgd=4.3V>VDD(3.3V)). Since the transistor M8 is turned on, the drain terminal of the transistor M8 is −3.3V. The gate terminal of the transistor M2 also receives the biasing voltage whose voltage level is greater than two times of the voltage level of the threshold voltage (Vbias>2V), i.e. 1V, and the source terminal of the transistor M2 is coupled to the drain terminal of the transistor M8 which is −3.3V, and therefore the transistor M2 is turned on, but operated in electrical over-stress (Vgs=4.3V>3.3V, and Vgd=4.3V>3.3V).

As a consequence, from the above description with reference to FIGS. 4A-4C, when the buffer circuit 100 is initially turned on and when the buffer circuit 100 enters the steady state, that is, the voltage level of the second voltage V2 is 0V and is −VDD, respectively, different voltage levels of the biasing voltage Vbias are needed to be provided to the gate terminals of the transistor M1 and the transistor M2 to turn on the transistor M2 and the transistor M8.

Figure 5A:
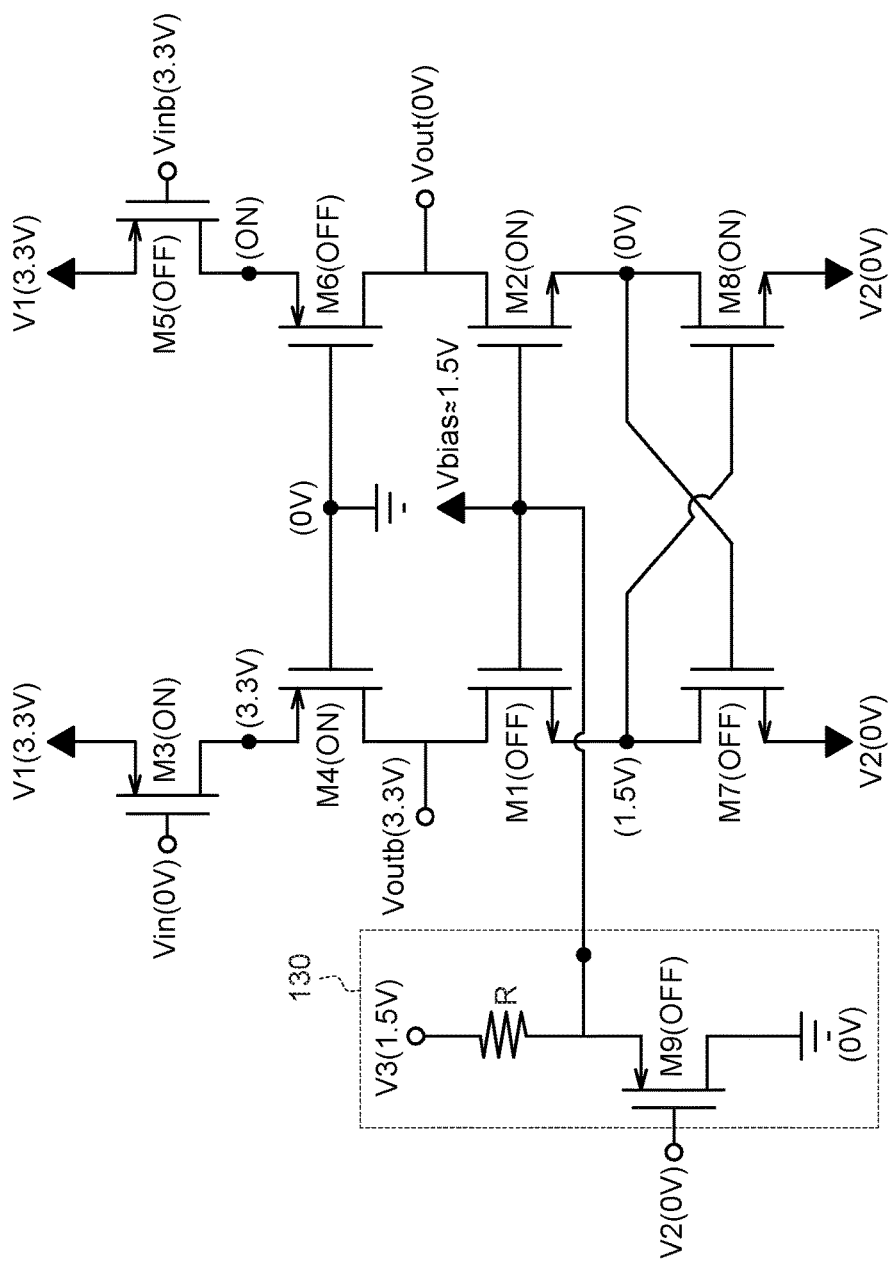
FIG. 5A and FIG. 5B show schematic diagrams illustrating the operating voltage level of all transistors and the voltage level of all nodes when the buffer circuit is initially turned on and when the buffer circuit enters the steady state, respectively.
Figure 5B:
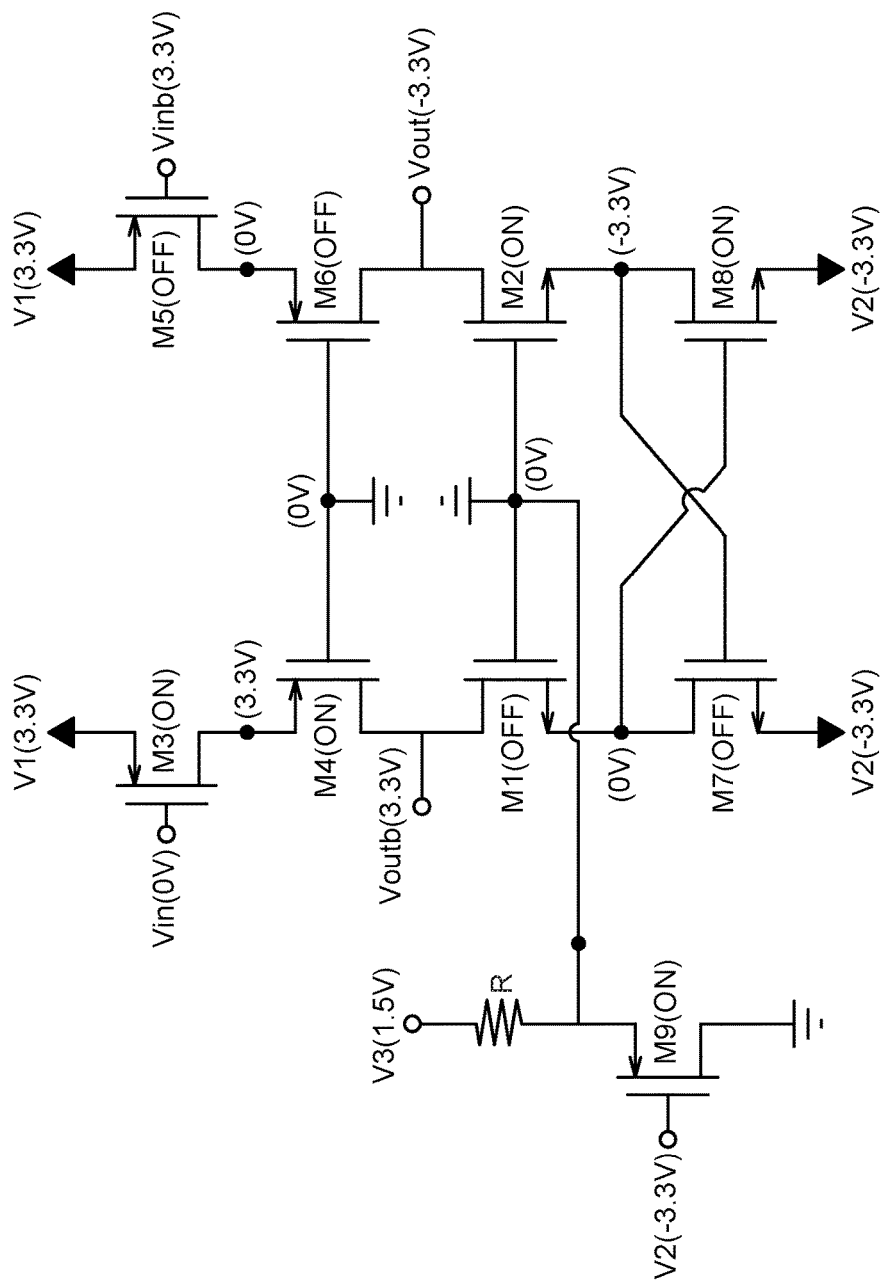

The voltage level of the biasing voltage Vbias adjusted dynamically by the voltage generator 130 is exemplified in an example below when the buffer circuit 100 is initially turned on and the buffer circuit 100 enters the steady state. FIG. 5A and FIG. 5B show schematic diagrams illustrating the operating voltage level of all transistors and the voltage level of all nodes when the buffer circuit 100 is initially turned on and when the buffer circuit 100 enters the steady state, respectively. When the buffer circuit 100 is initially turned on, as shown in FIG. 5A, the first terminal of the resistor R receives the third voltage V3, e.g. 1.5V. When the buffer circuit 100 is initially turned on, the voltage level of the second voltage V2 is 0V, and the gate terminal of the transistor M9 receives the second voltage V2 which is 0V, and therefore the transistor M9 is turned off so that the resistor R receives the third voltage V3 and the second terminal of the resistor R provides the biasing voltage of 1.5V. Since the voltage generator 130 provides the biasing voltage Vbias which is about 1.5V to the gate terminal of the transistor M2, the transistor M2 and the transistor M8 are turned on. And as shown in FIG. 5A, meanwhile, the transistor M2 and the transistor M8 are not operated in electrical over-stress (Vgs=1.5V≤3.3V, and Vgd=1.5V≤3.3V).

And when the buffer circuit 100 enters the steady state, as shown in FIG. 5B, the voltage level of the second voltage V2 is −3.3V, meanwhile, the gate terminal of the transistor M9 receives the second voltage V2 of −3.3V, whose voltage level is lower than the voltage level of the source terminal of the transistor M9 (about 1.5V), and therefore, the transistor M9 is turned on so that the source terminal of the transistor M9 provides the biasing voltage Vbias which is 0V. And as the voltage level of the second voltage V2 decreases gradually to −VDD, the biasing voltage Vbias is approaching to 0V since the transistor M9 is turned on. It is known by the person skilled in the art that the biasing voltage Vbias is not exactly equal to 0V, but is substantially equal to or approaching to 0V. Since the voltage generator 130 provides the biasing voltage Vbias which is 0V to the gate terminal of the transistor M2, the transistor M2 and the transistor M8 are turned on so that the output signal Sout of the voltage level −3.3 V may be provided at the output terminal Vout. And as shown in FIG. 5B, meanwhile, the transistor M2 and the transistor M8 are not operated in electrical over-stress (Vgs=3.3V≤3.3V, and Vgd=3.3V≤3.3V).

Based on the above, the voltage level of the biasing voltage Vbias is adjusted dynamically correspondingly according to the voltage level of the second voltage V2 by the voltage generator 130, so that the transistor M2 and the transistor M8 may both be turned on normally, and not be operated in electrical over-stress to provide the output signal Sout which is −3.3V at the output terminal Vout when the buffer circuit 100 is initially turned on and the buffer circuit 100 enters the steady state.

Figure 6:
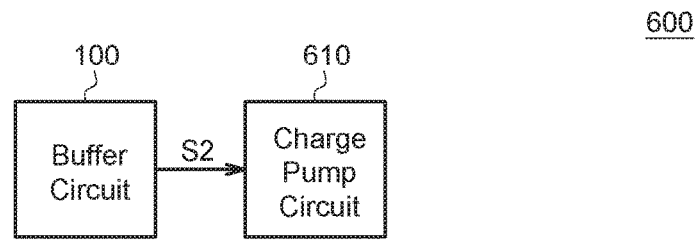
FIG. 6 shows a schematic diagram of an example of an application of a buffer circuit according to the first embodiment of the present disclosure.

FIG. 6 shows a schematic diagram of an example of an application of the buffer circuit 100 according to the first embodiment of the present disclosure. For example, a voltage generator 600 includes a charge pump circuit 610 and the buffer circuit 100 is used by the voltage generator 600 to control the signal S2 of the charge pump circuit 610.

Figure 7:
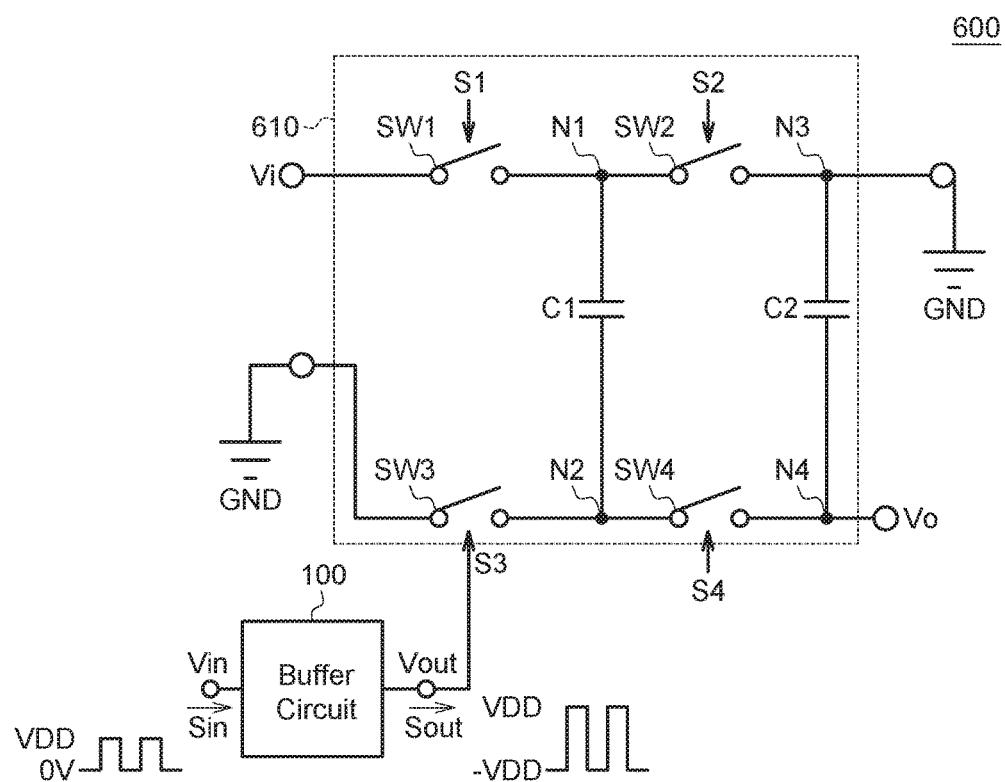
FIG. 7 shows a schematic diagram of an example of the voltage generator as shown in FIG. 6.

An example is described in detail below. Please refer to FIG. 7. FIG. 7 shows a schematic diagram of an example of the voltage generator 600 in FIG. 6. The charge pump circuit 610 includes an input terminal Vi, a capacitor C1, a capacitor C2, switches SW1-SW4, and an output terminal Vo. The capacitor C1 has a first terminal N1 and a second terminal N2. The capacitor C2 has a first terminal N3 and a second terminal N4. The first terminal N3 of the capacitor C2 is coupled to the ground terminal GND, and the second terminal N4 of the capacitor C2 is coupled to the output terminal Vo. The ground terminal GND has a ground voltage level, e.g. 0(V). In an embodiment, the output terminal has an output voltage level, e.g. −VDD(V). The switch SW1 is coupled between the input terminal Vi and the first terminal N1 of the capacitor C1, and is controlled by the control signal S1. The input terminal Vin has an input voltage level, e.g. VDD(V). The switch SW2 is coupled between the first terminal N1 of the capacitor C1 and the first terminal N3 of the capacitor C2, and is controlled by the control signal S2. The switch SW3 is coupled between the ground terminal GND and the second terminal N2 of the capacitor C1, and is controlled by the control signal S3. The switch SW4 is coupled between the second terminal N2 of the capacitor C1 and the second terminal N4 of the capacitor C2, and is controlled by the control signal S4. When the switch SW1 and switch SW3 are turned on, the switch SW2 and switch SW4 are turned off. And similarly, when the switch SW1 and switch SW3 are turned off, the switch SW2 and switch SW4 are turned on.

In this embodiment, the buffer circuit 100 is for providing the control signal S3 to the control terminal of the switch SW3. The buffer circuit 100 receives an input signal Sin at the input terminal Vin, and provides an output signal Sout at the output terminal Vout. The input signal Sin has the amplitude between the voltage level of the ground voltage (0V) and the voltage level of the first voltage V1 (VDD). The output signal Sout has the amplitude between the voltage level of the second voltage V2 (−VDD) and the voltage level of the first voltage V1 (VDD). In an embodiment, the second voltage V2 of the voltage generator 130 (as shown in FIG. 2) of the buffer circuit 100 is coupled to the output terminal Vo of the charge pump circuit 610. As the voltage level of the output terminal Vo changes, the voltage level of the biasing voltage Vbias is adjusted dynamically according to the voltage level of the second voltage V2 by the voltage generator 130.

According to the above embodiments, a buffer circuit 100 is provided. The buffer circuit 100 has an input terminal Vin for receiving an input signal Sin and an output terminal Vout for providing an output signal Sout. The buffer circuit includes a transistor cascode circuit 110, a latch circuit 120, a transistor M1, a transistor M2, and a voltage generator 130. The transistor cascode circuit 110 is biased at a first voltage V1, and the transistor cascode circuit 110 receives the input signal Sin. The latch circuit 120 is biased at a second voltage V2, and the voltage level of the second voltage V2 is negative. The transistor M1 and the transistor M2 are coupled between the transistor cascode circuit 110 and the latch circuit 120, and a gate terminal of the transistor M1 is coupled to a gate terminal of the transistor M2. The voltage generator 130 provides a biasing voltage Vbias to the gate terminals of the transistor M1 and the transistor M2 according to the second voltage V2. The voltage generator 130 adjusts a voltage level of the biasing voltage Vbias dynamically according to a voltage level of the second voltage V2. The biasing voltage Vbias is at a first level when the buffer circuit 100 is initially turned on, and the biasing voltage Vbias is at a second level when the buffer circuit 100 enters the steady state.

According to the above embodiments, a voltage generator using the buffer circuit is provided. The voltage generator includes the charge pump circuit 610, and uses the buffer circuit 100 to control the signal S2 of the charge pump circuit 610.

By adjusting the voltage level of the biasing voltage dynamically by the voltage generator, the buffer circuit in the present disclosure makes the transistors turn on normally, and not be operated in electrical over-stress to provide the output signal when the buffer circuit is initially turned on and when the buffer circuit enters the steady state, and thereby preventing the electrical elements from damage caused by the electrical over-stress issue. In addition, in comparison with the conventional circuit design, it may not require using the high voltage components in the present disclosure, and the cost of the circuit may be reduced accordingly.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A buffer circuit, having an input terminal for receiving an input signal and an output terminal for providing an output signal, wherein the buffer circuit comprises:
   a transistor cascode circuit biased at a first voltage and receiving the input signal;
   a latch circuit biased at a second voltage, wherein the voltage level of the second voltage is negative;
   a first transistor and a second transistor coupled between the transistor cascode circuit and the latch circuit, wherein a gate terminal of the first transistor is coupled to a gate terminal of the second transistor; and
   a voltage generator providing a biasing voltage to the gate terminals of the first transistor and the second transistor according to the second voltage;
   wherein the voltage generator adjusts a voltage level of the biasing voltage dynamically according to a voltage level of the second voltage; and the biasing voltage is at a first level when the buffer circuit is initially turned on, and the biasing voltage is at a second level when the buffer circuit enters a steady state.

2. The buffer circuit according to claim 1, wherein the first level is greater than a sum of the voltage level of a source voltage of the second transistor and a threshold voltage of the second transistor so that to turn on the second transistor, and the second level is substantially equal to a ground level.

3. The buffer circuit according to claim 1, wherein the voltage generator comprises:
   a resistor, having a first terminal and a second terminal, wherein the first terminal receives a third voltage, and the voltage level of the third voltage is greater than the first level; and
   a transistor, having a third terminal, a fourth terminal and a control terminal, wherein the third terminal is coupled to the second terminal of the resistor for providing the biasing voltage, the fourth terminal is coupled to a ground terminal, and the control terminal receives the second voltage.

4. The buffer circuit according to claim 3, wherein when the buffer circuit is initially turned on, the transistor is turned off so that the second terminal of the resistor provides the biasing voltage at the first level, and when the buffer circuit enters the steady state, the transistor is turned on so that the third terminal of the transistor provides the biasing voltage which is substantially equal to the ground level.

5. The buffer circuit according to claim 1, wherein the transistor cascode circuit comprises:
   a third transistor coupled to the input terminal for receiving the input signal, wherein the third transistor is biasing at the first voltage;
   a fourth transistor coupled to the third transistor;
   a fifth transistor receiving an inverted signal of the input signal and biasing at the first voltage; and
   a sixth transistor coupled between the fifth transistor and the output terminal, wherein a gate terminal of the sixth transistor is coupled to a gate terminal of the fourth transistor.

6. The buffer circuit according to claim 1, wherein the latch circuit comprises:
a seventh transistor coupled to the first transistor, wherein a gate terminal of the seventh transistor is coupled to the second transistor, and the seventh transistor is biasing at the second voltage; and
an eighth transistor coupled to the second transistor, wherein a gate terminal of the eighth transistor is coupled to the first transistor, and the eighth transistor is biasing at the second voltage.

7. A voltage generator circuit using a buffer circuit, wherein the buffer circuit has an input terminal for receiving an input signal and an output terminal for providing an output signal, the buffer circuit includes a transistor cascode circuit, a latch circuit, a first transistor, a second transistor, and a voltage generator, the transistor cascode circuit is biased at a first voltage, the transistor cascode circuit receives the input signal, the latch circuit is biased at a second voltage, the voltage level of the second voltage is negative, the first transistor and the second transistor are coupled between the transistor cascode circuit and the latch circuit, a gate terminal of the first transistor is coupled to a gate terminal of the second transistor, the voltage generator provides a biasing voltage to the gate terminals of the first transistor and the second transistor according to the second voltage, the voltage generator adjusts a voltage level of the biasing voltage dynamically according to a voltage level of the second voltage, the biasing voltage is at a first level when the buffer circuit is initially turned on, the biasing voltage is at a second level when the buffer circuit enters a steady state.

8. The voltage generator circuit according to claim 7, wherein the first level is greater than a sum of the voltage level of a source voltage of the second transistor and a threshold voltage of the second transistor so that to turn on the second transistor, and the second level is substantially equal to a ground level.

9. The voltage generator circuit according to claim 7, wherein the voltage generator comprises:
a resistor, having a first terminal and a second terminal, wherein the first terminal receives a third voltage, and the voltage level of the third voltage is greater than the first level; and
a transistor, having a third terminal, a fourth terminal and a control terminal, wherein the third terminal is coupled to the second terminal of the resistor for providing the biasing voltage, the fourth terminal is coupled to a ground terminal, and the control terminal receives the second voltage.

10. The voltage generator circuit according to claim 9, wherein when the buffer circuit is initially turned on, the transistor is turned off so that the second terminal of the resistor provides the biasing voltage at the first level, and when the buffer circuit enters the steady state, the transistor is turned on so that the third terminal of the transistor provides the biasing voltage which is substantially equal to the ground level.

11. The voltage generator circuit according to claim 7, wherein the transistor cascode circuit comprises:
a third transistor coupled to the input terminal for receiving the input signal, wherein the third transistor is biasing at the first voltage;
a fourth transistor coupled to the third transistor;
a fifth transistor receiving an inverted signal of the input signal and biasing at the first voltage; and
a sixth transistor coupled between the fifth transistor and the output terminal, wherein a gate terminal of the sixth transistor is coupled to a gate terminal of the fourth transistor.

12. The voltage generator circuit according to claim 7, wherein the latch circuit comprises:
a seventh transistor coupled to the first transistor, wherein a gate terminal of the seventh transistor is coupled to the second transistor, and the seventh transistor is biasing at the second voltage; and
an eighth transistor coupled to the second transistor, wherein a gate terminal of the eighth transistor is coupled to the first transistor, and the eighth transistor is biasing at the second voltage.

13. The voltage generator circuit according to claim 7, further comprising:
a first capacitor having a fifth terminal and a sixth terminal;
a second capacitor having a seventh terminal and a eighth terminal, wherein the seventh terminal is coupled to a ground terminal, the eighth terminal is coupled to a circuit output terminal;
a first switch coupled between a circuit input terminal and the fifth terminal of the first capacitor, and controlled by a first control signal;
a second switch coupled between the fifth terminal of the first capacitor and the seventh terminal of the second capacitor, and controlled by a second control signal;
a third switch coupled between the ground terminal and the sixth terminal of the first capacitor, and controlled by a third control signal;
a fourth switch coupled between the sixth terminal of the first capacitor and the eighth terminal of the second capacitor, and controlled by a fourth control signal;
wherein when the first switch and the third switch are turned on, the second switch and the fourth switch are turned off; and when the first switch and the third switch are turned off, the second switch and the fourth switch are turned on.

14. A voltage generator circuit comprising:
a buffer circuit, having an input terminal for receiving an input signal and an output terminal for providing an output signal, wherein the buffer circuit comprises:
a transistor cascode circuit biased at a first voltage and receiving the input signal;
a latch circuit biased at a second voltage, wherein the voltage level of the second voltage is negative; and
a first transistor and a second transistor coupled between the transistor cascode circuit and the latch circuit, wherein a gate terminal of the first transistor is coupled to a gate terminal of the second transistor; and
a voltage generator providing a biasing voltage to the gate terminals of the first transistor and the second transistor according to the second voltage;
wherein the voltage generator adjusts a voltage level of the biasing voltage dynamically according to a voltage level of the second voltage; and the biasing voltage is at a first level when the buffer circuit is initially turned on, and the biasing voltage is at a second level when the buffer circuit enters a steady state.

15. The voltage generator circuit according to claim 14, wherein the first level is greater than a sum of the voltage level of a source voltage of the second transistor and a threshold voltage of the second transistor so that to turn on the second transistor, and the second level is substantially equal to a ground level.

16. The voltage generator circuit according to claim 14, wherein the voltage generator comprises:
    a resistor, having a first terminal and a second terminal, wherein the first terminal receives a third voltage, and the voltage level of the third voltage is greater than the first level; and
    a transistor, having a third terminal, a fourth terminal and a control terminal, wherein the third terminal is coupled to the second terminal of the resistor for providing the biasing voltage, the fourth terminal is coupled to a ground terminal, and the control terminal receives the second voltage.

17. The voltage generator circuit according to claim 16, wherein when the buffer circuit is initially turned on, the transistor is turned off so that the second terminal of the resistor provides the biasing voltage at the first level, and when the buffer circuit enters the steady state, the transistor is turned on so that the third terminal of the transistor provides the biasing voltage which is substantially equal to the ground level.

18. The voltage generator circuit according to claim 14, wherein the transistor cascode circuit comprises:
    a third transistor coupled to the input terminal for receiving the input signal, wherein the third transistor is biasing at the first voltage;
    a fourth transistor coupled to the third transistor;
    a fifth transistor receiving an inverted signal of the input signal and biasing at the first voltage; and
    a sixth transistor coupled between the fifth transistor and the output terminal, wherein a gate terminal of the sixth transistor is coupled to a gate terminal of the fourth transistor.

19. The voltage generator circuit according to claim 14, wherein the latch circuit comprises:
    a seventh transistor coupled to the first transistor, wherein a gate terminal of the seventh transistor is coupled to the second transistor, and the seventh transistor is biasing at the second voltage; and
    an eighth transistor coupled to the second transistor, wherein a gate terminal of the eighth transistor is coupled to the first transistor, and the eighth transistor is biasing at the second voltage.

\* \* \* \* \*